United States Patent
Byrne et al.

(10) Patent No.: US 6,701,395 B1
(45) Date of Patent: Mar. 2, 2004

(54) ANALOG-TO-DIGITAL CONVERTER THAT PRESEEDS MEMORY WITH CHANNEL IDENTIFIER DATA AND MAKES CONVERSIONS AT FIXED RATE WITH DIRECT MEMORY ACCESS

(75) Inventors: Eamonn Joseph Byrne, Couty Cork (IE); Patrick Michael Mitchell, County Clare (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/019,946

(22) Filed: Feb. 6, 1998

(51) Int. Cl.[7] .......................... G06F 3/00; G06F 13/00; H04L 5/00; H04L 1/00
(52) U.S. Cl. .......................... 710/69; 710/22; 710/26; 710/28; 341/50; 341/141
(58) Field of Search .......................... 710/22, 28, 69, 710/99, 56, 26; 711/6, 200, 202, 212; 701/99; 341/50, 141

(56) References Cited

U.S. PATENT DOCUMENTS

| | | | | |
|---|---|---|---|---|
| 4,272,760 A | | 6/1981 | Prazek et al. ............... | 341/120 |
| 4,476,531 A | * | 10/1984 | Marino et al. ............... | 701/99 |
| 5,111,425 A | * | 5/1992 | Takeuchi et al. ............... | 710/22 |
| 5,212,795 A | * | 5/1993 | Hendry ............... | 710/28 |
| 5,224,070 A | | 6/1993 | Fandrich et al. ............... | 365/185.33 |
| 5,242,848 A | | 9/1993 | Yeh ............... | 438/266 |

(List continued on next page.)

FOREIGN PATENT DOCUMENTS

| | | |
|---|---|---|
| EP | 0 592 069 A1 | 4/1994 |
| EP | 8-293566 | 11/1996 |
| EP | 0 757 356 A1 | 2/1997 |
| JP | 57114905 * | 7/1982 |
| WO | WO 97/30452 | 8/1997 |

OTHER PUBLICATIONS

Intersil Corporation, Aug. 1997, H17188, 8–Channel sigma–delta programmable A/D subsystem, pp. 7/1847–7/1868, www.intersil.com.*

Analog–Digital Conversion handbook, 1986 by Analog Devices, Inc., pp. 17–106.*

"Data acquisition chip offers sensor–to–system solution", Electronic Products, Jan. 1999, pp. 39–40.

(List continued on next page.)

Primary Examiner—Jeffrey Gaffin
Assistant Examiner—Tammara Peyton
(74) Attorney, Agent, or Firm—Wolf, Greenfield & Sacks, P.C.

(57) ABSTRACT

An integrated circuit including a DMA controller, an ADC having a plurality of conversion channels and address and data ports for connection to external memory means, the DMA controller being arranged to read a channel id from the memory means using the address and data port which channel id is representative of one of the said conversion channels, to pass the read channel id to the ADC, to cause the ADC to perform an analog-to-digital-conversion on the conversion channel represented by the channel id, to receive the conversion result from the ADC and to write the conversion result back to the memory means using the address and data ports. Also, an integrated circuit including a microcontroller having an output port, an address valid output line, a latch coupled to the output port, and a latch control fine coupled to the latch control of the latch the microcontroller being operable to present a first range of address bits at its output port, to activate the latch control line to cause the latch to latch the first range of bits, to present a second range of address bits at its output port and to activate the address valid line to indicate that the combination of the first and second ranges present on the latch outputs and the output port respectively, are valid.

13 Claims, 8 Drawing Sheets

U.S. PATENT DOCUMENTS

| | | | | |
|---|---|---|---|---|
| 5,313,618 A | | 5/1994 | Pawloski | 703/28 |
| 5,375,218 A | * | 12/1994 | Umeda | 710/22 |
| 5,375,228 A | | 12/1994 | Leary et al. | 714/33 |
| 5,390,317 A | | 2/1995 | Weiss et al. | 711/103 |
| 5,426,769 A | | 6/1995 | Pawloski | 710/20 |
| 5,467,200 A | | 11/1995 | Ohsawa et al. | 358/426 |
| 5,483,239 A | * | 1/1996 | Arczynski et al. | 341/141 |
| 5,488,688 A | | 1/1996 | Gonzales et al. | 714/34 |
| 5,504,684 A | | 4/1996 | Lau et al. | 455/3.02 |
| 5,515,320 A | | 5/1996 | Miwa | 365/185.1 |
| 5,535,357 A | | 7/1996 | Moran et al. | 711/103 |
| 5,581,695 A | | 12/1996 | Knoke et al. | 714/28 |
| 5,627,784 A | | 5/1997 | Roohparvar | 365/189.01 |
| 5,630,164 A | | 5/1997 | Williams et al. | 703/24 |
| 5,651,128 A | | 7/1997 | Gaultier | 711/103 |
| 5,686,917 A | * | 11/1997 | Odom et al. | 341/141 |
| 5,752,077 A | | 5/1998 | Yiu et al. | 710/7 |
| 5,758,059 A | | 5/1998 | Alexander | 714/30 |
| 5,767,729 A | | 6/1998 | Song | 327/390 |
| 5,768,194 A | | 6/1998 | Matsubara et al. | 365/105.33 |
| 5,781,750 A | | 7/1998 | Blomgren et al. | 712/209 |
| 5,784,284 A | * | 7/1998 | Taraki | 702/66 |
| 5,796,139 A | | 8/1998 | Fukase | 257/315 |
| 5,805,865 A | | 9/1998 | Mimura et al. | 703/28 |
| 5,835,788 A | * | 11/1998 | Blumer et al. | 710/23 |
| 5,848,026 A | | 12/1998 | Ramamurthy et al. | 365/238.5 |
| 5,857,094 A | | 1/1999 | Nemirovsky | 703/28 |
| 5,862,073 A | | 1/1999 | Yeh et al. | 365/185.01 |
| 5,862,148 A | | 1/1999 | Typaldos et al. | 714/724 |
| 5,872,954 A | | 2/1999 | Matsushita | 703/23 |
| 5,873,112 A | | 2/1999 | Norman | 711/103 |
| 5,889,480 A | * | 3/1999 | Kim | 341/50 |
| 5,898,862 A | | 4/1999 | Vajapey | 703/28 |
| 5,900,008 A | | 5/1999 | Akao et al. | 711/100 |
| 5,901,330 A | | 5/1999 | Sun et al. | 710/8 |
| 5,937,423 A | | 8/1999 | Robinson | 711/103 |
| 5,953,255 A | | 9/1999 | Lee | 365/185.29 |
| 5,954,813 A | | 9/1999 | Mann et al. | 712/43 |
| 5,956,277 A | | 9/1999 | Roohparvar | 365/201 |
| 5,963,473 A | | 10/1999 | Norman | 365/185.02 |
| 5,974,015 A | * | 10/1999 | Iizuka et al. | 369/60 |
| 5,989,960 A | | 11/1999 | Fukase | 438/267 |
| 6,009,496 A | | 12/1999 | Tsai | 711/103 |
| 6,012,109 A | * | 1/2000 | Schultz | 710/56 |
| 6,016,555 A | | 1/2000 | Deao et al. | 714/35 |
| 6,023,522 A | * | 2/2000 | Draganoff et al. | 382/124 |

OTHER PUBLICATIONS

Leonard, Milt, "Self–programming microcontroller networks sensors and transducers", Electronic Design, Feb. 9, 1998, pp. 92, 94.

Clinton Kuo et al., "A 512–kb EEPROM Embedded in a 32–b Microcontroller," *IEEE, Journal of Solid State Circuits,* vol. 2 No. 4, Apr. 1992, pp. 574–581.

Babb et al, "Logic Emulation with Virtual Wires", IEEE Trans on Computer–Aided Design of Int. Circuits and Systems, vol. 16, Issue 6, pp. 609–626, Jun. 1997.

Babb et al, "The RAW Benchmark Suite: Computation Structures for General Purpose Computing", Proc. $5^{th}$ Ann. IEEE Symp. on Field–Programmable Custom Computing Machines, pp. 134–143, Apr. 1997.

Dahl et al, "Emulation of the SPARCLE Microprocessor with the MIT Virtual Wires Emulation System", Proc. IEEE Workshop FPGAs for Custom Comp. Machines, pp. 14–22, Apr. 1994.

Babb et al, "Virtual Wires: Overcoming Pin Limitations in FPGA—based Logic Emulators", Proc. IEEE Workshop on FPGAs for Custom Comp. Machines, pp. 142–151, Apr. 1993.

"Ikos Grabs Emulation Firm, VMW", Electronic Engineering Times, pp. 1, Mar. 18, 1996.

Motorola, DSP56100 Technical Data, Section 10, On–Chip Emulation (OnCE).

Motorola, Digital Signal Processor (DSP), Application Development System (ADS) User's Manual, Sections 1–6.

* cited by examiner

| Address | D7 | D6 | D5 | D4 | D3 | D2 | D1 | D0 | Description |
|---|---|---|---|---|---|---|---|---|---|
| 402000H | 0 | 0 | 0 | 1 | | | | | Convert ADC Ch #1 |
| 402001H | | | | | | | | | |
| 402002H | 0 | 0 | 1 | 0 | | | | | Convert ADC Ch #2 |
| 402003H | | | | | | | | | |
| 402004H | 0 | 1 | 0 | 1 | | | | | Convert ADC Ch#5 |
| 402005H | | | | | | | | | |
| 402006H | 0 | 0 | 1 | 1 | | | | | Convert ADC Ch #3 |
| 402007H | | | | | | | | | |
| 402008H | 1 | 0 | 0 | 0 | | | | | Convert Temp Sensor |
| 402009H | | | | | | | | | |
| 40200AH | 1 | 1 | 1 | 1 | | | | | Stop DMA |

| Address | D7 | D6 | D5 | D4 | D3 | D2 | D1 | D0 | Description |
|---|---|---|---|---|---|---|---|---|---|
| 402000H | 0 | 0 | 0 | 1 | D12 | D11 | D10 | D9 | ADC Ch #1 High Byte |
| 402001H | D8 | D7 | D6 | D5 | D4 | D3 | D2 | D1 | ADC Ch #1 Low Byte |
| 402002H | 0 | 0 | 1 | 0 | D12 | D11 | D10 | D9 | ADC Ch #2 High Byte |
| 402003H | D8 | D7 | D6 | D5 | D4 | D3 | D2 | D1 | ADC Ch #2 Low Byte |
| 402004H | 0 | 1 | 0 | 1 | D12 | D11 | D10 | D9 | ADC Ch #5 High Byte |
| 402005H | D8 | D7 | D6 | D5 | D4 | D3 | D2 | D1 | ADC Ch #5 Low Byte |
| 402006H | 0 | 0 | 1 | 1 | D12 | D11 | D10 | D9 | ADC Ch #3 High Byte |
| 402007H | D8 | D7 | D6 | D5 | D4 | D3 | D2 | D1 | ADC Ch #3 Low Byte |
| 402008H | 1 | 0 | 0 | 0 | | | | | Convert Temp Sensor |
| 402009H | | | | | | | | | |
| 40200AH | 1 | 1 | 1 | 1 | | | | | Stop DMA |

Fig. 7

ANALOG-TO-DIGITAL CONVERTER THAT PRESEEDS MEMORY WITH CHANNEL IDENTIFIER DATA AND MAKES CONVERSIONS AT FIXED RATE WITH DIRECT MEMORY ACCESS

FIELD OF THE INVENTION

The present invention relates to an analog-to-digital converter (ADC) with direct memory access (DMA) and in particular to an integrated circuit including an ADC with DMA.

BACKGROUND OF THE INVENTION

As conversion times of ADCs reduce, increasing burdens are placed on processor time. In the preferred embodiment described below, for example, the conversion time of the ADC is 5 microseconds with the result that during continuous conversion (where the ADC immediately commences a new conversion after completing the previous conversion) the ADC is providing new conversion results at a rate of 200 KHz. For a typical microcontroller operating at 12 MHZ, dealing with conversion results at this rate may under prior art schemes, be an almost full time task. Conventionally, two possible methods of processing conversion results have been used.

Firstly, the conversion results may be processed by an interrupt routine. In this method, the ADC interrupts the microcontroller after each conversion. The microcontroller enters an interrupt service routine which reads the conversion results and stores them in memory. It will be appreciated that when the processing overheads associated with servicing an interrupt routine are taken into account, and bearing in mind that the microcontroller may need to read and write several words of data to store the full resolution of the conversion result, that very little (if any) processor time is available for the microcontroller to perform any other tasks.

Secondly, an alternative method is to cause the microcontroller to continuously poll a busy bit that busy bit being used by the ADC to indicate when a conversion is complete. It will be appreciated that the polling of the busy bit frequently enough not significantly to slow the continuous conversion rate of the ADC, places a considerable processing burden on the microcontroller. Thus, in common with the first method above, very little (if any) processing time is left for the microcontroller to perform other tasks.

Thus in the prior art techniques, the conversion rate of an ADC has been limited by the processing speed of an associated microcontroller.

SUMMARY OF THE INVENTION

In a first aspect, the present invention comprises an integrated circuit including a DMA controller, an ADC having a plurality of conversion channels, and address and data ports for connection to external memory means, the DMA controller being arranged to read a channel id from the memory means using the address and data ports which channel id is representative of one of the said conversion channels, to pass the read channel id to the ADC, to cause the ADC to perform an analog-to-digital-conversion on the conversion channel represented by the channel id, to receive the conversion result from the ADC and to write the conversion result back to the memory means using the address and data ports.

Thus by interacting with the DMA controller, a microcontroller may be relieved of the burden of storing ADC conversion results in the external memory means. Typically, the interaction will be performed via flags typically in a dedicated special function riser (SFR).

The DMA controller typically is implemented in the form of a state machine.

A particularly useful feature of the claimed invention is the ability to select channels of a multi-channel ADC without processor intervention. If the conversion results are written back to the same address in the memory means from which the channel id associated with that conversion result was read without corrupting the channel id stored at that address, the DMA controller may usefully be set to run through the same addresses to perform conversions on the same channels an unlimited number of times without requiring the microcontroller to write new channel ids to external memory before each continuous conversion occurs.

It will be appreciated that the term address is used to refer to a "word" address. For example, in the preferred embodiment described below, the microcontroller has only an 8 bit data bus. The conversion result is, however, of 12 bits. Thus the conversion result spans 2 bytes and to read this word address the microcontroller must actually read 2 byte addresses. A consequence of this also in the preferred embodiment is that channel ids are written to alternate byte addresses before continuous conversion commences.

According to a first method aspect of the present invention, a method of performing a plurality of analog-to-digital conversions using an integrated circuit connected to memory means and having an ADC including a plurality of conversion channels and a DMA controller comprises preseeding the memory means with a predetermined sequence of channel ids each representative of a respective conversion channel, reading a first of the channel ids from the memory means, performing an analog-to-digital conversion on one of the plurality of conversion channels, the channel being selected according to a read channel id, writing the conversion result back to the memory means repeating the reading step with a subsequent channel id until the channel id is representative of an end instruction.

According to a further aspect, an integrated circuit includes a microcontroller having an output port, an address valid output line, a latch coupled to the output port, and a latch control line coupled to the latch control of the latch, the microcontroller being operable to present a first range of address bits at its output port to activate the latch control fine to cause the latch to latch the first range of bits, to present a second range of address bits it its output port and to activate the address valid line to indicate that the combination of the first and second ranges present on the latch outputs and the output port respectively, are valid.

In this way, with the inclusion of a minimal amount of additional hardware, a microcontroller having for example an 8 bit data or address bus may have the bit-width of that bus expanded. The output port may also output data first (which is latched) and then an address or vice versa.

BRIEF DESCRIPTION OF THE DRAWINGS

The present invention will now be described by way of example with reference to the drawings in which:

FIG. 7 shows a portion of external memory after continuous conversion;

DETAILED DESCRIPTION

Figure 1:
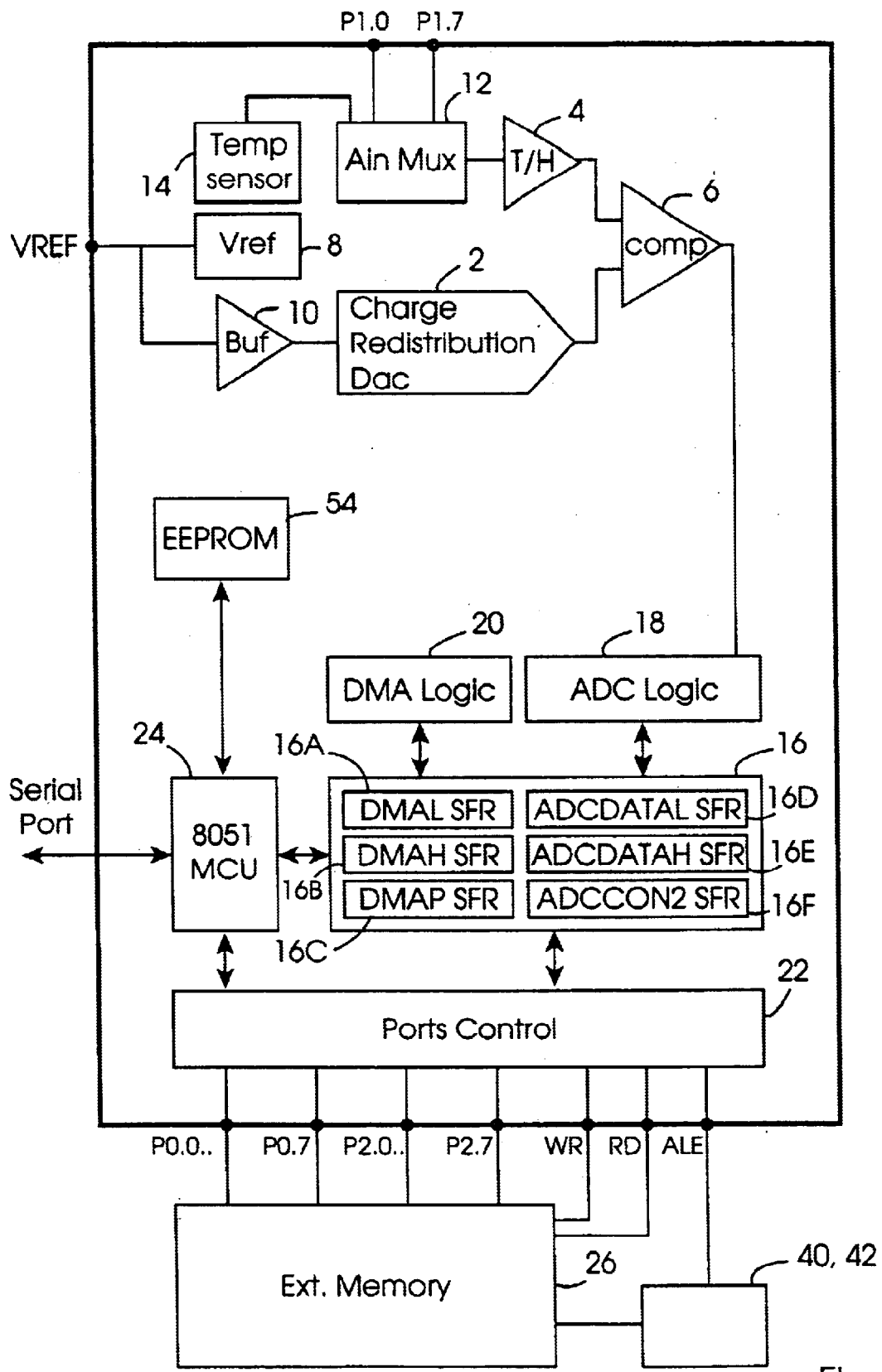
FIG. 1 is a schematic block diagram of the microcontroller, DMA controller, ADC and external memory.

With reference to FIG. 1, an ADC, DMA control logic and an 8051 microcontroller are shown connected to external memory.

The ADC is a successive approximation converter having a charge redistribution digital-to-analog converter (DAC) 2, a track and hold circuit 4 both coupled to a comparator 6. The design includes a reference voltage generator 8 connected via a buffer 10 to the input of the DAC 2.

Conventional microcontroller integrated circuits have required a DAC to be implemented using a timer to generate a pulse-width-modulated (PWM) signal which is fed into a large capacitor to smooth the PWM signal and to produce a signal having a voltage which varies depending on the mark-space ratio of the PWM signal. This at the very least is inconvenient since it uses up a timer/counter which could otherwise be used for other functions and requires microcontroller intervention. In the embodiment described below, two dedicated DACs have been provided.

An analog multiplexer 12 is used to select either the output from a temperature sensor 14 or one of the eight analog inputs P1.0 to P1.7.

A register block 16 is coupled to ADC logic 18, DMA logic 20 and port control logic 22.

The register block 16 contains DMA address SFRs 16A, 16B, 16C which are 8 bit SFRs containing the low byte, high byte and page address of the address in external memory which is being written to or read from during DMA operation. Thus, these registers form a 24 bit address pointer. Initially, these registers are loaded with the start address in external memory from which a channel id is first read and to which the corresponding conversion result is subsequently written during DMA continuous conversion. The address stored in these registers is incremented during DMA operation.

The register block 16 also includes two bit ADC data registers 16D, 16E which store temporary results of ADC conversions before storage in memory or are used to hold the result of a single conversion. The sixth register 16F is an 8 bit control register for the ADC. The ADC SFRs are described in more detail below, An 8051 compatible microcontroller 24 is coupled to the port control logic 22 to provide external data and address buses and also to the register block 16. The microcontroller's interaction with the DMA logic and the ADC is achieved via the register block 16.

External memory 26 is connected to port 0 and port 2. These ports in conjunction with the write (WR), read (RD) and address latch enable (ALE) lines enable the microcontroller and the DMA logic 20 to read and write to the external memory.

Figures 2, 3:
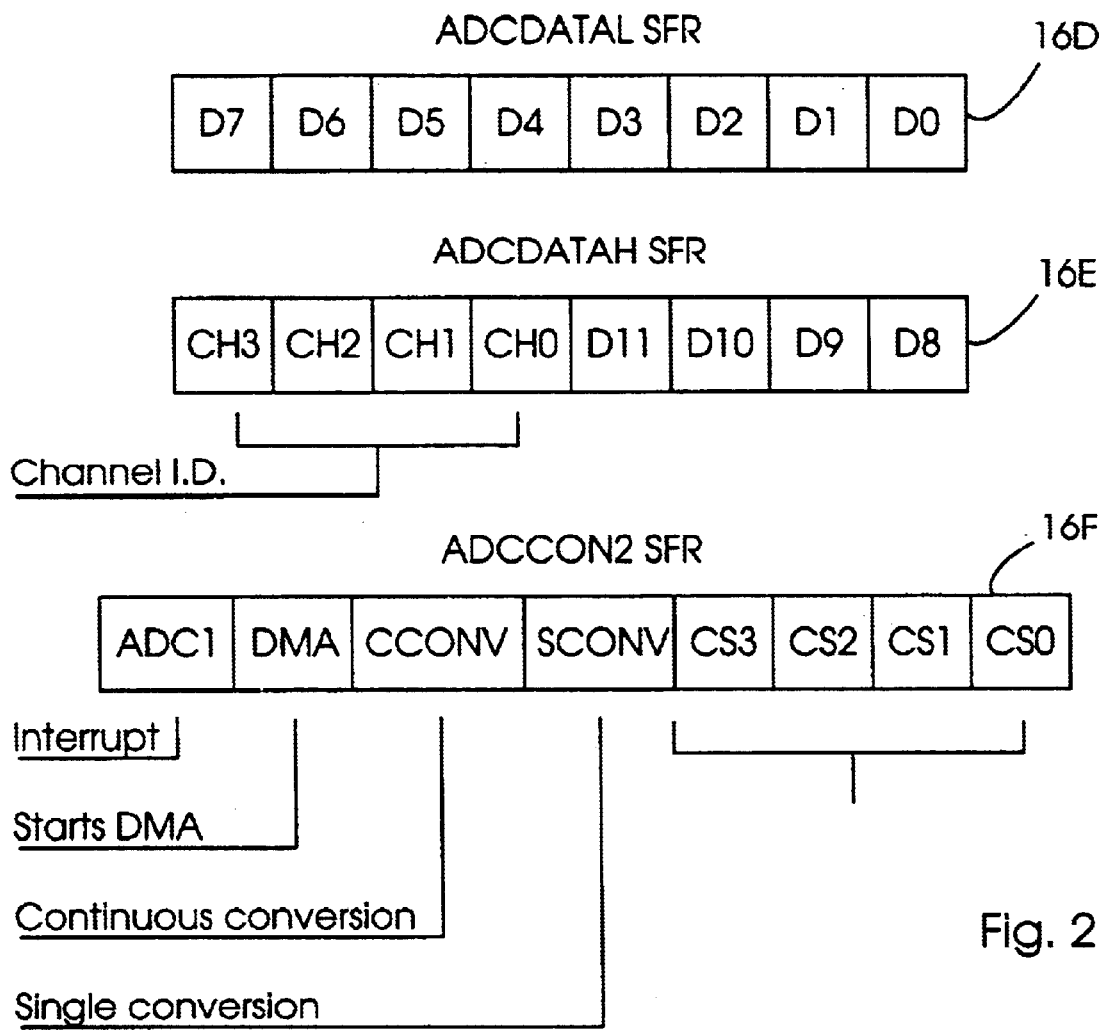
FIG. 2 is a detailed schematic view of three of the registers of FIG. 1.
FIG. 3 shows the relationship between channel select bits and the channel selected for conversion.

The three ADC registers 16D, 16E, 16F of the register block are shown in more detail in FIG. 2.

Before entering DMA mode, the microcontroller 24 is programmed to write to external memory specifying the ADC channels to convert. This is achieved by writing for each channel to be converted, a byte containing a 4 bit channel id in its top 4 bits to external memory. Each of these bytes is written to consecutively alternate bytes in external memory. An 'all ones' channel id is used to signify the end of continuous conversion.

FIG. 3 shows the relationship between the channel select bits and the channel which is converted by the ADC.

Figures 4, 5:
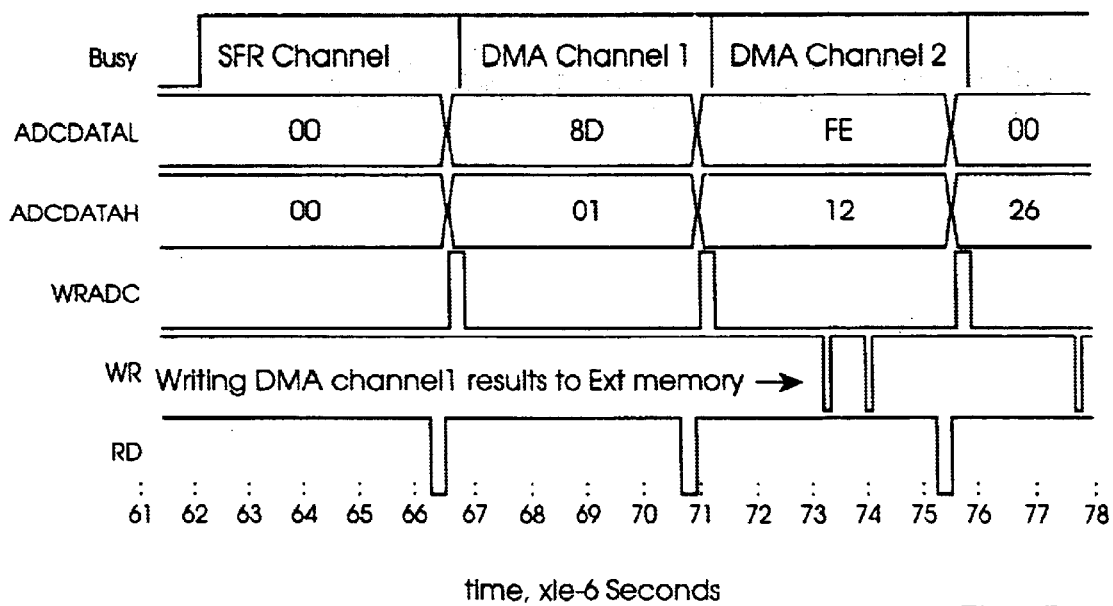
FIG. 4 shows a portion of external memory prior to continuous conversion.
FIG. 5 shows timing signals for the first three ADC conversions.

With reference to FIG. 4, the external memory is pre-seeded with the channel ids at alternative byte addresses. In the example given, the first address is 402000H. As will be described below, the 12 bit result of the conversion is stored in the remaining bits of that address and in the 8 bits of the subsequent address (402001M). This is achieved by writing two bytes. The first byte contains the channel id and the high four bits of the 12 bit conversion result and the second byte contains the low 8 bits of the conversion result. Thus the channel id is actually overwritten when the conversion result is written to external memory, but it is overwritten with the same channel id that was originally contained in those high 4 bits.

Since the channel id is not corrupted by the DMA operation, if the same sequence of channels is repeatedly to be converted, there is no need for the pre-seeding operation to be performed more than once. All that is required to convert the same sequence again is to reset the DMA SFRs to the start address and to initiate DMA continuous conversion.

Before continuous conversion occurs, the microcontroller is caused to load the start address (402000H in the example) into the SFRs 16A, 16B and 16C and to set the CCONV flag in the ADCCON2 SPR 16F which requests continuous conversion and the DMA bit which starts DMA.

Once DMA mode has been initiated in this way, the microcontroller may continue to execute code without using any processing time to deal with the ADC conversion proms. For extremely high precision ADC conversions, it may be desirable to reduce digital noise present on the substrate by putting the microcontroller into an idle mode for the duration of the DMA continuous conversion operation. When the DMA operation is complete, an interrupt is generated by the DMA controller to signal to the microcontroller that the ADC conversion results may now be processed. If the microcontroller is in idle mode when the interrupt is generated, the interrupt has the effect of 'waking up' the microcontroller.

Thus, for example, the microcontroller may initiate a continuous conversion of say, 4000 values, leave the DMA controller performing the conversions carry on with housekeeping tasks using internal EEPROM and RAM and then once the conversions are complete, process the results using an FFT for example.

FIG. 5 shows some of the timing signals for the first three conversions once continuous conversion has been initiated.

During continuous conversion, a DMA state machine is initiated which generates internal and external signals. The external signals which are controlled by the state machine are those present on port 0, port 2 and the ALE, WR and RD signals mentioned above.

It will be noted that the DMA operation is arranged to interleave the memory reading and writing operations of a previous conversion such that these operations occur simultaneously with the next ADC conversion. In this way, no timing overhead is introduced by the DMA mode and therefore the ADC can convert at its maximum rate.

The state machine also generates internal signals 'busy' which is high during ADC conversion. ADCDATAL and ADCDATAH which represents data flow into the 2 SFRs 16D and 16E and a WRADC signal which causes writing of the conversion result into the SFRs 16D and 16E.

Figure 6:
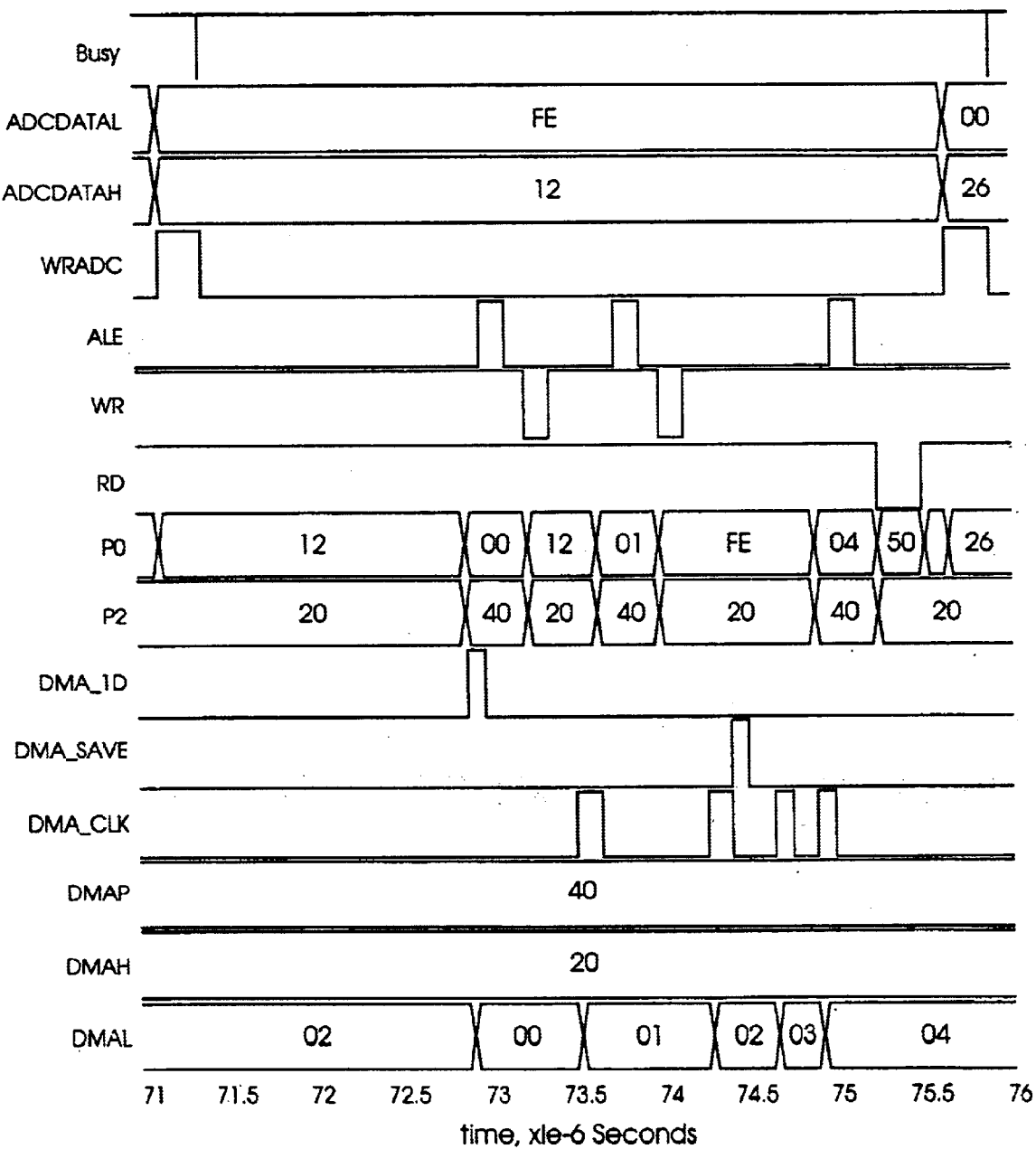
FIG. 6 shows detailed timing signals for one ADC conversion.

FIG. 6 shows the detailed DMA timing for one conversion. The signals are the same as those of FIG. 5 with the addition of 'P0' which represents port 0 and which carries the low address byte or data, 'P2' which represents port 2 and which carries an address high byte or middle byte, aDMA_LD sig which loads the DMA address SFRs (registers 16A to 16C of FIG. 1) with the values of a twenty-four bit latch 30 (previously loaded with earlier values of the DMA SFRs as described below), DMA_CLK which clocks the DMA address SFRs to cause the address stored therein to be incremented by one and a DMA_SAVE signal which causes the present address of the DMA address registers 16A, 16B, 16C to be latched. The address stored in the latches is retrieved using the DMA_LD signal.

As will be seen from FIGS. 5 and 6, during conversion, the previous results are written out to external memory using ALE and WR and the next channel id is read in using ALE and RD. The detailed interaction between the ALE and WR and RD signals is described below.

Since a channel id for the next conversion is read in from the external memory during the present analog-to-digital conversion, the first conversion is performed on the channel specified by the ADCCON2 SFR (register 16F of FIG. 1). The first channel converted is that specified in the 4 bits CS0 to CS3 of FIG. 2. This data is not stored in external data memory and therefore the NWR signal is not active until the third conversion. Thus to convert n DMA channels, n+1 conversions are performed.

With particular reference to FIG. 6, it will be seen that the first conversion result is written to memory locations 402000H and 402001H. The channel selected by the channel id from location 402002H is in the process of being converted. The DMA_LD signal loads the DMA SFRs with 402000H. After writing the high byte of the previous conversion result (actually 4 bits of channel id and 4 bits of 12 bit result) the signal DMA_CLK increments the DMA SFRs to 402001. Now the low byte of the previous conversion result is written to external memory. At this point the DMA SFRs are incremented again (to 402002H) and this value is then stored in the DMA save latches using the DMA_SAVE signal. The DMA SFRs now have the value 402002H. The DMA SFRs are then incremented by two addresses (by using the DMA_CLK signal) to allow reading of the next channel id for conversion. When the conversion is complete, the cycle continues with the latched (saved) address being used to write the conversion result back to the address from which the channel id was read.

Thus the sequence of operations after the first three conversions is:

i. commence conversion of channel
    ii. load latched address into DMA address SFRs using DMA_LD signal
    iii. write high byte of previous conversion result
    iv. increment DMA address SFRs by one
    v. write low byte of previous conversion result
    vi. increment DMA address SFRs by one
    vii. save address in DMA address SFRs in latch using DMA_SAVE signal
    viii. increment DMA address SFRs by two
    ix. read next channel id
    x. conversion completes (result in ADCDATA SFRs)
    xi. start cycle again When a channel id of all ones is read, the state machine flags an interrupt using the ADCI bit of SFR 16F and clears the DMA and CCONV bits of that register.

FIG. 7 shows the portion of external memory shown in FIG. 4 after continuous conversion has been performed. Thus it will be seen that the memory has been filled with 12 bit conversion results the remaining 4 bits containing the channel id which identifies the channel which has been converted, It will be noted that the results for the last conversion (in the example, the temperature sensor) are not stored in external memory but remain in the ADCDATAL and ADCDATAH SFRs. These may be caused to be in to external memory by specifying an additional channel id for conversion.

Figure 8:
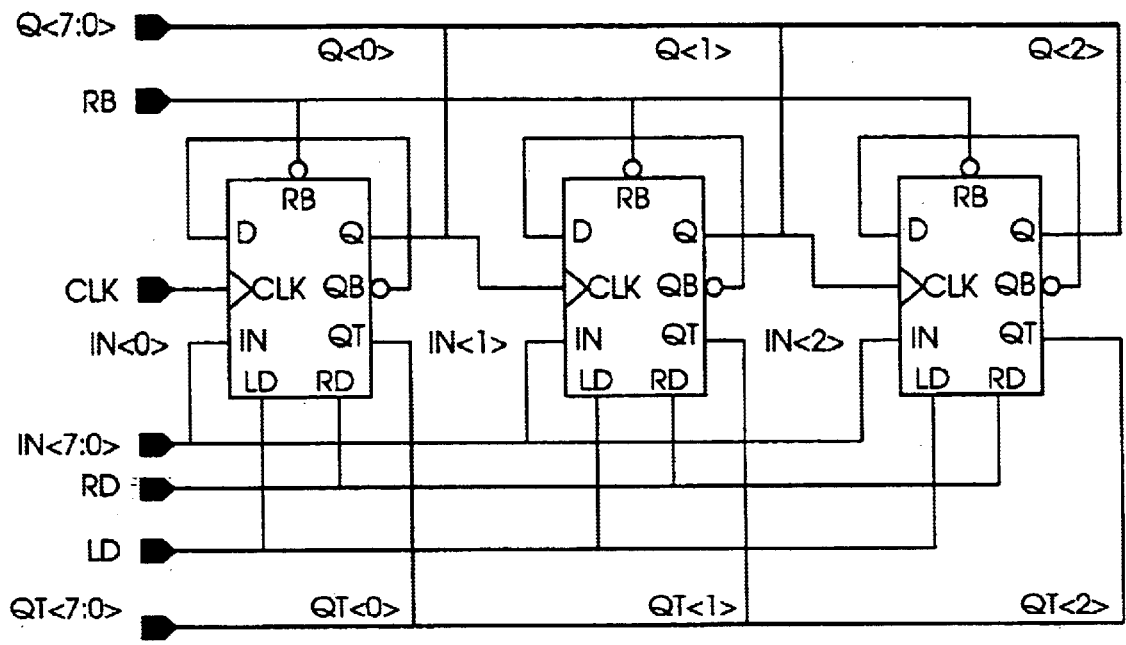
FIG. 8 is a schematic block diagram of one of the DMA SFRs.

FIG. 8 shows 3 bits of an 8 bit DMA SFR configured as a counter. The 3 DMA SFRs together form a 24 bit binary counter which is achieved by connecting the QB output to the D input and the Q output to the CLK input of the next stage. The cell has an RB input which ensures that the cell resets to 0 on power up. All of the outputs of the SFR are connected to a common bus which allows the microcontroller 24 to read the contents of the SFR. The read is achieved using the RD and QT pins. The microcontroller and DMA controller are able to load the SFR with 8 bits of parallel data by activating the LD signal and providing the data on the IN bus.

Figure 9:
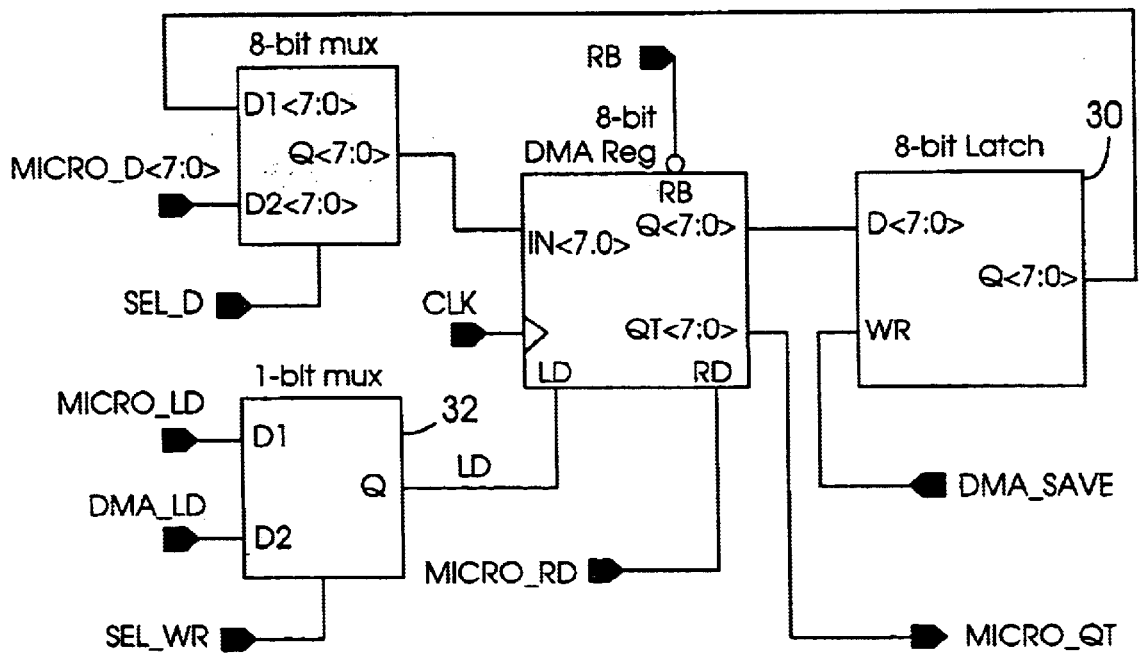
FIG. 9 is a schematic block diagram of the DMA interface.

With reference to FIG. 9, each of the 3 DMA SFRs can be loaded with 8 bit data from one of two sources; either the microcontroller via the micro_D bus or an 8 bit latch 30. This is the latch described above which is used to store the address from which the channel id is read using the DMA_SAVE signal. The LD signal is selected from MICRO_LID and DMA_LD signals as shown in the Figure. The data in the register is saved in the latch 30 when the DMA_SAVE signal goes high. The one bit multiplexer 32 is used to select which Id sign is used.

Figure 10:
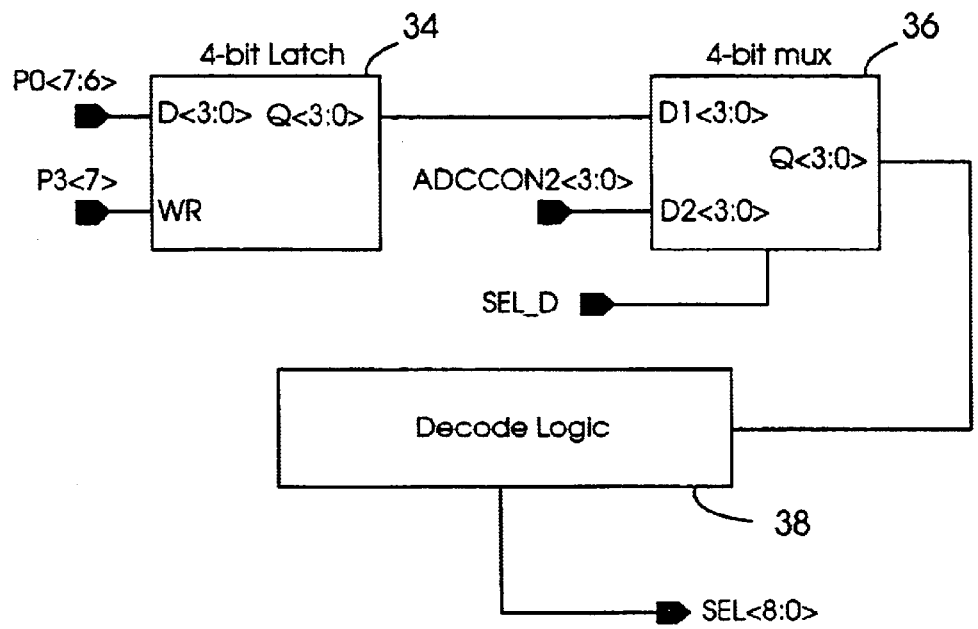
FIG. 10 is a schematic block diagram of channel selection logic.

FIG. 10 shows how channels are selected. The WR signals causes 4 bit latch 34 to latch the channel id from port 0. In non DMA mode, the channel selection is determined by 4 bits stored in the ADCCON2 SFR. In DMA mode, a multiplexer 36 enables the output of the 4 bit latch into decode logic 38 which then decodes the bus to select the appropriate channel for conversion.

Preferably, at least some of the DMA SFRs 16A, 16B, 16C are shared with registers used by the microcontroller 24 as data pointers. In the case of an 8051 compatible microcontroller, the microcontroller has two registers DPL and DPH forming the low and high bytes respectively of a sixteen bit data pointer which is used for accessing external memory. In one preferred embodiment, in DMA mode, the registers DPL and DPH are the same registers as the DMAL and DMAH registers. The addition of the DMAP register increases the address range of the DMA controller from the microcontroller's 16 bit range to a 24 bit range. Alternatively, the three DMA address registers may be separate registers from the DPL and DPH registers. This alterative arrangement allows the microcontroller to be put into an idle mode during DMA operation without disabling the DMA address registers. Either way, it is important, that the microcontroller should not access ports 0 or 2 or the ALE line during DMA since these are driven by the DMA controller (and not the microcontroller core) during DMA operation.

Figure 11:
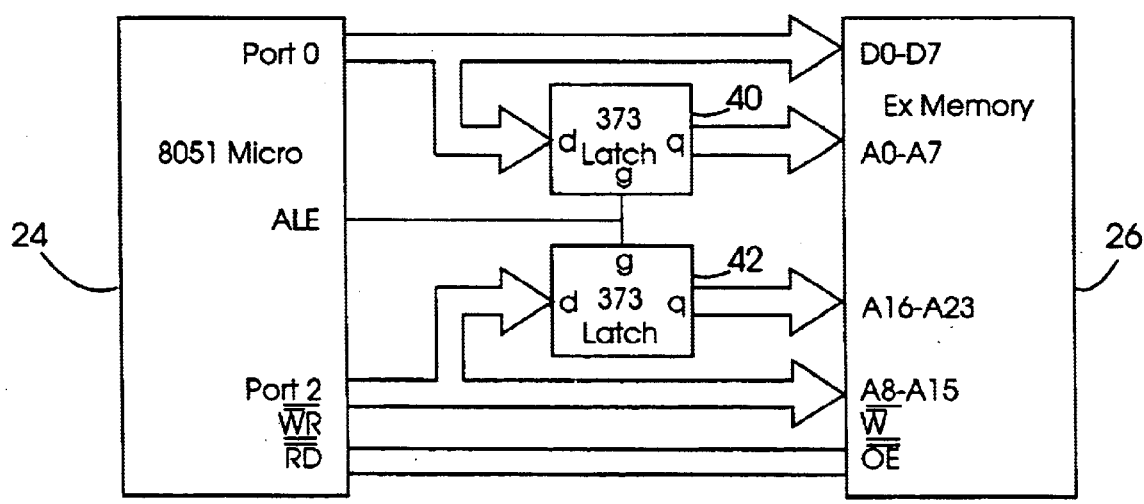
FIG. 11 is a schematic block diagram of the connection between a microcontroller and external memory.

FIG. 11 shows how port 0, port 2 and the ALE, WR and RD signals interact to permit writing and reading to and from external memory. With reference to the Figure, the microcontroller 24 has ports 0 and 2 coupled to external memory 26 and to 8 bit latches 40 and 42 respectively. The outputs of ports 0 and 2 are latched when the ALE signal is active.

Figure 12:
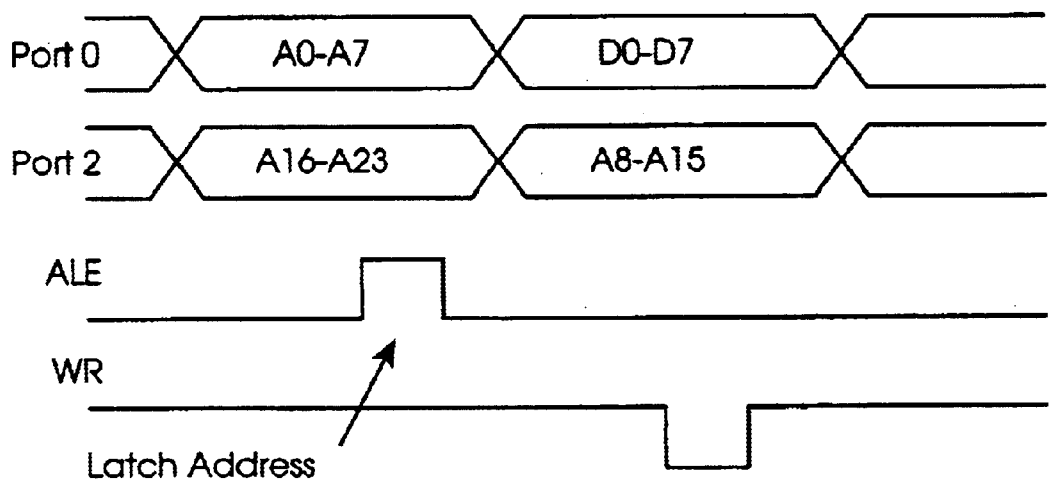
FIG. 12 shows timing for a write to external memory.
Figure 13:
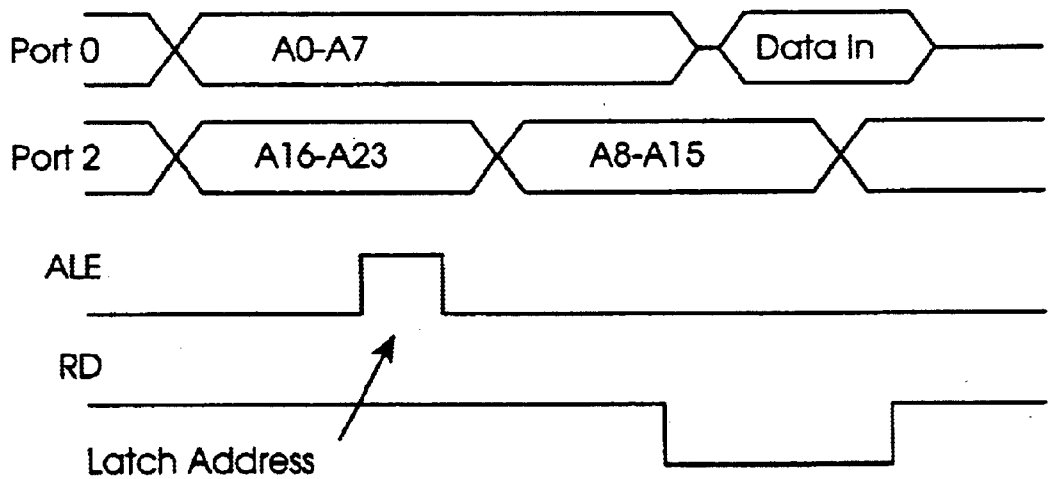
FIG. 13 shows timing for a read firm external memory.

In this way, port 0 is used to provide multiplexed address (A0 to A7) and data (D0 to D7) and port 2 is used to provide multiplexed addresses (A8 to A15) and (A16 to A23). This allows the microcontroller to address memory using 24 bit addressing using only 8 bit ports. The timing of write to external data memory and reading from external data memory is shown in FIGS. 12 and 13 respectively. During the first half of the cycle, the low order of the address is provided on port 0 and the high order of address is provided on port 2. These are latched using the signal ALE. The latch holds the data for the duration of the memory cycle. During the second half of the memory cycle, port 2 is used for addresses (A8 to A15) and port 0 is used for the 8 bit data bus. The data is read or written depending on the WR and RD signals.

It will be appreciated that during normal operation, the microcontroller core drives the ALE, WR and RD signals and ports 0 and 2 to achieve 24 bit addressing. In DMA mode, the DMA controller (in the form of the state machine described above) is responsible for generating the necessary signals on these lines and ports to achieve writing and reading in a 24 bit address space. In each case, the timing is as shown in FIGS. 12 and 13.

If only 16 bit addressing s desired, the latch 42 may be omitted. No other changes are required. This is possible because it has been chosen to output the high 8 address bits (A16–A23) in the first half of the cycle. Thus when WR or RD become active (towards the end of the second half of the cycle), it is the values A8–A15 which are available on port 2. Since WR or RD are not active in the first half of the cycle, any data output on port 2 (and not latched) is ignored by any memory-mapped devices such as external memory.

As described above, the provision of dedicated DACs means that the microcontroller 24 and its timer/counters are freed up for other uses during digital-to-analog conversions. Furthermore, this is achieved without requiring software modifications to be made tyo code which can run on existing 8051 compatible microcontrollers.

What is claimed is:

1. An integrated circuit including an analog-to-digital converter to make conversions at a fixed rate, a micro-controller that pre-seeds a memory with channel identifier data for controlling an order of the conversions, and a DMA controller which causes conversion results to be written to the memory.

2. An integrated circuit as claimed in claim 1, in which the micro-controller initiates the DMA controller to access the memory to write a sequence of conversion results, and the micro-controller is interrupted by the DMA controller at the end of the sequence of conversions.

3. An integrated circuit as claimed in claim 1, in which, once started, a sequence of conversions does not require intervention from a micro-controller contained within the integrated circuit.

4. An integrated circuit as claimed in claim 3, in which the microcontroller executes code during the conversion process without devoting time to deal with the analog to digital conversion process.

5. An integrated circuit including a DMA controller and an analog-to-digital converter, wherein the analog-to-digital converter is arranged to make conversions at a fixed rate, and results of the conversions are written to memory, and wherein the memory is pre-seeded with channel identifier data for controlling an order of the conversions.

6. An integrated circuit including a DMA controller and an analog-to-digital converter, wherein the analog-to-digital converter is arranged to make conversions at a fixed rate and results of the conversions are written to a memory by the DMA controller, and in which the integrated circuit reads channel identifiers in a predetermined sequence from addresses in the memory and reads a subsequent identifier in the predetermined sequence, while the analog-to-digital converter performs conversion on a channel represented by a previous read channel identifier.

7. An integrated circuit as claimed in claim 6, in which the reading of channel identifiers is performed without processor intervention from a data processor included within the integrated circuit.

8. An integrated circuit comprising a memory, a DMA controller, and an analog-to-digital converter to make conversions, wherein results of the conversions are written to the memory, and wherein the memory is pre-seeded with channel identifier data for controlling an order of the conversions.

9. A method for processing analog-to-digital conversions, comprising:

pre-seeding a memory with channel identifier data for controlling a sequence of the conversions;

reading channel identifier data in a predetermined order from addresses in the memory;

converting analog data to corresponding digital data according to the channel identifier data; and writing results of the conversions to memory.

10. The method claimed in claim 9, wherein pre-seeding the memory comprises writing data to the memory.

11. An integrated circuit, including a state machine for controlling access to a memory and an analog-to-digital converter, wherein the memory is pre-written with channel identifier data for controlling an order of analog-to-digital conversions, and the results of the conversions are written to the memory by the state machine.

12. An integrated circuit according to any one of claims 1–8 and 11 wherein the results of conversions are written to memory in association with corresponding channel identifier date.

13. A method according to claim 9 wherein writing results of conversions to memory includes writing to memory associated channel identifier dates.

* * * * *

UNITED STATES PATENT AND TRADEMARK OFFICE
CERTIFICATE OF CORRECTION

PATENT NO. : 6,701,395 B1
DATED : March 2, 2004
INVENTOR(S) : Byrne et al.

It is certified that error appears in the above-identified patent and that said Letters Patent is hereby corrected as shown below:

Title page,
Item [75], Inventors, should read -- Eamonn Joseph Byrne, County Cork --
Item [57], ABSTRACT,
Line 2, should read -- having a plurality of conversion channels, and address and --
Line 5, should read -- memory means using the address and data ports which --
Line 15, should read -- line coupled to the latch control of the latch, the microcon- --

Column 2,
Line 5, should read -- dedicated special function register (SFR). --
Line 48, should read -- address bits at its output port, to activate the latch control line --
Line 50, should read -- a second range of address bits at its output port and to --

Column 3,
Line 21, should read -- FIG. 13 shows timing for a read from external memory. --
Line 65, should read -- described in more detail below. --

Column 4,
Line 26, should read -- subsequent address (402001H). This is achieved by writing --
Line 45, should read -- in the ADCCON2 SFR 16F which requests continuous --
Line 49, should read -- any processing time to deal with the ADC conversion process. --
Line 61, should read -- continuous conversion of, say, 4000 values, leave the DMA --
Line 62, should read -- controller performing the conversions, carry on with house- --

Column 5,
Line 14, should read -- ADCDATAH which represents data flowing into the 2 SFRs --
Line 22, should read -- aDMA_LD signal which loads the DMA address SFRs --
Line 43, should read -- memory and therefore the WR signal is not active until the --

UNITED STATES PATENT AND TRADEMARK OFFICE
CERTIFICATE OF CORRECTION

PATENT NO. : 6,701,395 B1
DATED : March 2, 2004
INVENTOR(S) : Byrne et al.

It is certified that error appears in the above-identified patent and that said Letters Patent is hereby corrected as shown below:

Column 6,
Line 21, should read -- bit conversion results, the remaining 4 bits containing the --
Line 27, should read -- and ADCDATAH SFRs. These may be caused to be written to --
Line 47, should read -- SAVE signal. The LD signal is selected from MICRO_LD --
Line 51, should read -- which id signal is used. --

Column 7,
Line 23, should read -- addressing using only 8 bit ports. The timing of writing to --
Line 42, should read -- If only 16 bit addressing is desired, the latch 42 may be --

Signed and Sealed this

Ninth Day of August, 2005

JON W. DUDAS
*Director of the United States Patent and Trademark Office*